(12) United States Patent
Gregory

(10) Patent No.: US 6,528,375 B2
(45) Date of Patent: *Mar. 4, 2003

(54) BIPOLAR TRANSISTOR COMPATIBLE WITH CMOS UTILIZING TILTED ION IMPLANTED BASE

(75) Inventor: Haydn James Gregory, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/817,656

(22) Filed: Mar. 26, 2001

(65) Prior Publication Data

US 2001/0010382 A1 Aug. 2, 2001

Related U.S. Application Data

(62) Division of application No. 09/312,879, filed on May 17, 1999, now Pat. No. 6,262,472.

(51) Int. Cl.$^7$ .............................................. H01L 21/336
(52) U.S. Cl. ...................... 438/302; 438/350; 438/313
(58) Field of Search ................................. 438/348, 350, 438/358, 364, 365, 361, 370, 413, 302; 257/579, 583, 592

(56) References Cited

U.S. PATENT DOCUMENTS

| 3,500,143 A | 3/1970 | Lamming | 317/235 |
| 3,697,827 A | 10/1972 | Simon | 317/235 |
| 4,047,217 A | 9/1977 | McCaffrey et al. | 357/34 |
| 4,452,645 A | 6/1984 | Chu et al. | 148/1.5 |
| 4,662,062 A | 5/1987 | Toyooka et al. | 29/578 |
| 4,710,241 A | 12/1987 | Komatsu | |

(List continued on next page.)

FOREIGN PATENT DOCUMENTS

| FR | 2570 879 A | 9/1984 | H01L/29/72 |
| JP | 401147864 A | 6/1989 | H01L/29/72 |
| JP | 402077133 A | 3/1990 | H01L/31/10 |
| JP | 405090196 A | 4/1993 | H01L/21/28 |
| JP | 406224208 A | 8/1994 | H01L/21/331 |

OTHER PUBLICATIONS

Belucea, C. "Control of emitter current crowding in bipolar junction transistors using laterally–graded base doping profiles", Int. J. Electronics, 1993, vol. 74, No. 4, pp. 553–566.

Tsui, Paul G. Y. et al., "A Versatile Half–Micron Complementary BiCMOS Technology for Microprocessor–Based Smart Power Applications", IEEE Transactions on Electron Devices, vol. 42, No. 3, Mar. 1995.

*Primary Examiner*—David Nelms
*Assistant Examiner*—Dung A Le
(74) *Attorney, Agent, or Firm*—Stallman & Pollock LLP

(57) ABSTRACT

A bipolar transistor compatible with CMOS processes utilizes only a single layer of polysilicon while maintaining the low base resistance associated with conventional double-polysilicon bipolar designs. Dopant is implanted to form the intrinsic base through the same dielectric window in which the polysilicon emitter contact component is later created. Following poly deposition within the window and etch to create the polysilicon emitter contact component, large-angle tilt ion implantation is employed to form a link base between the intrinsic base and a subsequently-formed base contact region. Tilted implantation enables the link base region to extend underneath the edges of the polysilicon emitter contact component, creating a low resistance path between the intrinsic base and the extrinsic base. Fabrication of the device is much simplified over a conventional double-poly transistor, particularly if tilted implantation is already employed in the process flow to form an associated structure such as an LDMOS.

6 Claims, 6 Drawing Sheets

U.S. PATENT DOCUMENTS

| | | |
|---|---|---|
| 4,713,355 A | 12/1987 | Gardner |
| 4,721,685 A | 1/1988 | Lindenfelser et al. |
| 4,729,965 A | 3/1988 | Tamaki et al. |
| 4,745,087 A | 5/1988 | Iranmanesh |
| 4,772,566 A | 9/1988 | Zdebel et al. |
| 4,789,885 A | 12/1988 | Brighton et al. ............... 357/34 |
| 4,871,685 A | 10/1989 | Taka et al. |
| 4,962,053 A | 10/1990 | Spratt et al. |
| 4,996,581 A | 2/1991 | Hamasaki ................... 357/34 |
| 5,006,476 A | 4/1991 | De Jong et al. |
| 5,055,419 A | 10/1991 | Scovell et al. |
| 5,213,989 A | 5/1993 | Fitch et al. |
| 5,242,858 A | 9/1993 | Sakamoto et al. |
| 5,420,051 A | 5/1995 | Bohr et al. |
| 5,444,004 A | 8/1995 | Jang |
| 5,580,798 A | 12/1996 | Grubisich |
| 5,605,849 A | 2/1997 | Chen et al. .................... 148/31 |
| 5,643,809 A | 7/1997 | Lien |
| 5,698,459 A | 12/1997 | Grubisich et al. |
| 5,726,069 A | 3/1998 | Chen et al. |
| 5,731,240 A | 3/1998 | Kataoka ..................... 438/364 |
| 5,773,350 A | 6/1998 | Herbert et al. ............. 438/364 |
| 5,926,721 A | 7/1999 | Hong et al. |
| 6,043,130 A * | 3/2000 | Gregory ..................... 438/350 |

* cited by examiner

BIPOLAR TRANSISTOR COMPATIBLE WITH CMOS UTILIZING TILTED ION IMPLANTED BASE

This application is a divisional of application Ser. No. 09/312,879, filed May 17, 1999 now U.S. Pat. No. 6,262,472.

BACKGROUND OF THE INVENTION

1. Field of the Invention

The present invention relates to a bipolar transistor having a polysilicon emitter and, in particular, to a bipolar device formed utilizing a single polysilicon layer and a tilted ion-implanted link base region that may readily be incorporated into existing CMOS processes.

2. Description of the Related Art

The majority of integrated circuit designs employ some form of digital signal processing. These conventional logic structures dictate the use of complementary MOS (CMOS) device architectures. In the pursuit of enhanced performance and greater flexibility, IC designers have increasingly relied upon circuits that combine both bipolar and MOS transistor technologies. For maximum process efficiency, a polysilicon bipolar transistor should be formed in a process flow that shares as many processing steps as possible with a standard CMOS process flow. However, creating a process flow that successfully integrates bipolar and MOS architectures can pose a significant challenge.

FIG. 1A shows a cross-sectional view of a conventional NPN bipolar transistor device which includes a diffused polysilicon emitter structure formed from a single polysilicon layer. Conventional single-poly NPN bipolar transistor 100 lies within N-well 102 formed in P-type silicon 104. Conventional single-poly bipolar transistor 100 is electrically isolated from the effects of adjacent semiconductor devices by inter-device isolation structures 106.

NPN transistor 100 further includes a buried N+ collector layer 108 connected to collector contact 110 by N+ sinker structure 112. Collector contact 110 may be conveniently formed during the source/drain implant steps of an associated CMOS process. Collector contact 110 and sinker 112 are electrically insulated from the remainder of transistor 100 by intra-device isolation structure 114.

Bipolar transistor 100 also includes P-type base 116 having a P+ base contact 118. Base 116 consists of intrinsic base region 116a and extrinsic base region 116b. As used in this patent application, the term "intrinsic base" refers to that portion of the base directly underneath the collector. The term "extrinsic base" refers to that portion of the base region of the bipolar transistor which is not directly underneath the collector.

Base 116 may be formed within N-well 102 during implantation of dopant to form the lightly doped drain (pldd) regions of associated CMOS devices. Base contact 118 may be formed during the source/drain implant of associated CMOS devices.

Bipolar transistor 100 further includes diffused polysilicon emitter structure 122. Emitter 122 includes a polysilicon contact component 122a and a diffused single crystal component 122b. Polysilicon contact component 122a may be formed from the same N-type polysilicon layer used to create the gates of associated CMOS devices. Diffused single crystal component 122b is formed by thermal diffusion of N-type dopant from polysilicon contact component 122a into base 116.

Conventional single-poly bipolar transistor 100 also includes an overlying dielectric material 124.

While the conventional single-poly bipolar transistor shown in FIG. 1A is useful in many applications, it suffers from the disadvantage of exhibiting a relatively high base resistance.

FIG. 1B shows an enlarged cross-sectional view of an edge portion of the emitter base junction of the device of FIG. 1A. During operation of bipolar transistor 100, the bulk of the charge traveling between base contact 118 and intrinsic base 116a must traverse conductive path 126.

Because the overlying interconnect must make contact with both polysilicon emitter component 122a and base contact region 118, regions 116a and 118 must be separated to ensure electrical isolation between the contacts. Therefore, conductive path 126 traverses a relatively long distance. The length of path 126 in turn creates high electrical resistance.

The elevated high base resistance acts to degrade device performance. In particular, equation (I) determines the maximum frequency of switching of the transistor:

$$(I)\ f_{MAX} = f_T / (8\pi C_{JBC} R_B),\ \text{where:}$$

$f_{MAX}$ = frequency at which unilateral power gain is unity $f_T$ = unity gain cutoff frequency $C_{JBC}$ = base-collector junction capacitance $R_B$ = base resistance (intrinsic + extrinsic)

Thus, a higher overall base resistance will reduce the switching frequency of the transistor. A low $f_{MAX}$ is particularly problematic given the extremely rapid switching frequencies demanded by modern, high-speed digital applications.

In order to reduce base resistance and thereby overcome this disadvantage, device engineers have implemented a double-polysilicon bipolar transistor design. FIG. 2A shows a cross-sectional view of a conventional double-poly NPN bipolar transistor device.

Double-poly NPN bipolar transistor 200 lies within N-well 202 formed within P-type silicon 204. Conventional double-poly bipolar transistor 200 is electrically isolated from the effects of adjacent semiconductor devices by inter-device isolation structures 206.

Bipolar transistor 200 includes a buried N+ collector layer 208 connected to collector contact 210 by N+ sinker structure 212. Collector contact 210 may conveniently be formed during the source/drain implant steps of an associated CMOS process. Collector contact 210 and sinker 212 are electrically isolated from remainder of transistor 200 by intra-device isolation structure 214.

Bipolar transistor 200 further includes a doped base layer 216, which includes an intrinsic base region 216a. Diffused polysilicon base 218 overlies and is separated from doped base layer 216 by a first dielectric layer 219. Diffused polysilicon base 218 includes a polysilicon contact component 218a and a diffused single crystal silicon component 218b.

Polysilicon base contact 218a is formed from a P-type polysilicon layer. Single crystal base component 218b is formed by diffusion of P type dopant from polysilicon base contact 218a into doped base layer 216.

Bipolar transistor 200 further features diffused polysilicon emitter structure 222 which is formed over and separated from polysilicon base 218a by second dielectric layer 224. Diffused polysilicon emitter structure 222 includes polysilicon emitter contact component 222a and single crystal diffused emitter component 222b.

Polysilicon emitter contact 222a is formed from a second doped polysilicon layer of N-type conductivity, as could be used to form the gates of associated CMOS transistors Single crystal emitter component 222b is formed by diffusion of N-type dopant from polysilicon component 222a into doped base layer 216.

FIG. 2B is an enlarged view of an edge portion of the emitter/base junction of the device of FIG. 2A. FIG. 2B reveals that because single crystal base component 218b is self-aligned to single crystal emitter component 222b, regions 218b and 222b are separated by only the width of second dielectric layer 224 (typically less than 0.4 μm). This configuration is made possible by the presence of polysilicon base contact component 218a, and single crystal base component 218b, which provide highly doped, low-resistance conductive path 226 to intrinsic base 216a.

While the conventional double-poly bipolar transistor structure addresses significant performance disadvantages of the conventional single-poly bipolar transistor, this design suffers from a serious disadvantage in the form of more complex processing. Specifically, the double-poly bipolar transistor depicted in FIG. 2A requires additional polysilicon deposition, implant, masking, and etching steps to create the diffused polysilicon base structure. Each of these added steps confers a process penalty in the form of reduced yield and increased cost.

In particular, utilizing separate polysilicon layers can introduce a "poly stringer" problem. This "poly stringer" problem is a result of deposition of a second polysilicon layer occurring over sharp corners of raised features of a first polysilicon layer. Such a double-polysilicon structure is difficult to etch without leaving behind filaments ("stringers") from the second polysilicon layer.

This "poly stringer" problem can be eliminated by forming an intervening dielectric layer between the two polysilicon layers. However, this solution requires additional processing steps to form the dielectric layer. These additional steps further degrade overall throughput and thus increase expense.

The enhanced complexity in fabricating a double-poly bipolar transistor is particularly troublesome when the processing requirements of associated CMOS devices are taken into account.

Therefore, there is a need in the art for a bipolar transistor structure compatible with a CMOS process flow that maintains low base resistance while preserving process simplicity.

SUMMARY OF THE INVENTION

The present invention proposes a bipolar transistor compatible with CMOS processes that utilizes only a single layer of polysilicon. The design in accordance with the present invention maintains lowered base resistance and superior performance associated with conventional double-poly bipolar transistors, while preserving process simplicity.

The present invention utilizes implantation of dopant to form the intrinsic base through the same nitride window in which a diffused polysilicon emitter structure will later be created. Following polysilicon deposition, implant, and etching, a tilted implant is used to form a link base region.

This link base creates a short, highly doped, low resistance path between the base contact and the diffused polysilicon emitter.

Because the present invention employs only a single polysilicon layer, the process flow is much simpler than that associated with formation of the conventional double-poly structure. This advantage is even more apparent where tilted ion implantation must already be employed in the process to form an LDMOS or some other associated semiconductor structure.

A first embodiment of a process for forming a bipolar transistor in accordance with the present invention comprises the steps of forming a well of a first conductivity type in a semiconductor material, forming a buried highly doped collector region of the first conductivity type in the well, and forming a dielectric layer having a window over the collector region in the well. Next, dopant of a second conductivity type opposite the first conductivity type is introduced through the window to form an intrinsic base region. A polysilicon layer is then formed over the dielectric layer and within the window. Dopant of the first conductivity type is then introduced into the polysilicon layer, and the polysilicon layer is etched to form a polysilicon emitter contact component structure extending at least over the window. Dopant of the first conductivity type is then introduced into the semiconductor material directly underneath the polysilicon emitter contact component and above the intrinsic base to form a single crystal emitter component, and dopant of the second conductivity type is ion implanted at an angle of less than 90° to the semiconductor material to form a link base region, the link base region extending underneath the polysilicon emitter contact component and overlapping the intrinsic base region.

A first embodiment of a single-poly bipolar transistor in accordance with the present invention comprises a well of a first conductivity type formed in a semiconductor material, a subsurface collector region of the first conductivity type located in the well, and an intrinsic base region of the second conductivity type formed in the well above the collector region. A single crystal emitter component of the first conductivity type is formed in the well above the intrinsic base region. A polysilicon emitter contact component of the first conductivity type is formed over the intrinsic emitter. A base contact region is formed in the well adjacent to the polysilicon emitter component, and a link base region of the second conductivity type is formed in the well by tilted ion implantation, the link base extending laterally underneath the polysilicon emitter contact component and overlapping with the intrinsic base region and the base contact region.

The features and advantages of the present invention will be understood upon consideration of the following detailed description of the invention and the accompanying drawings.

DETAILED DESCRIPTION OF THE INVENTION

Figure 1A:
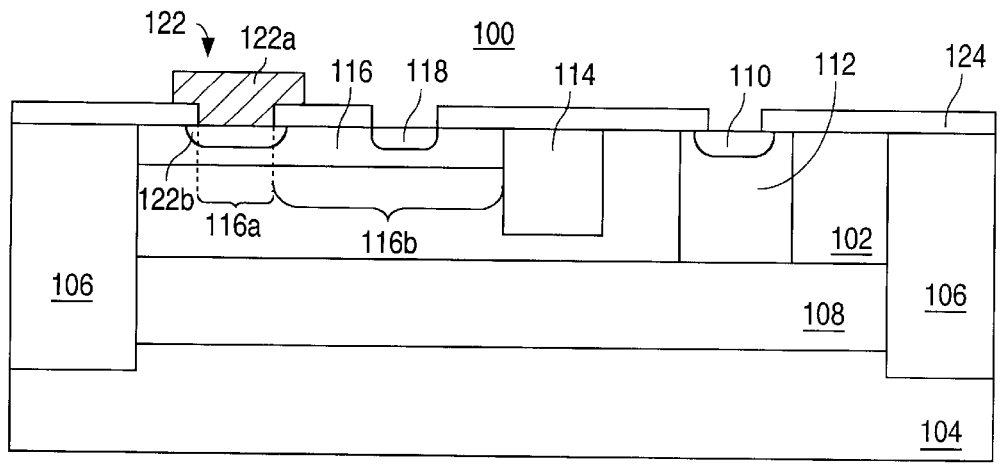
FIG. 1A shows a cross-sectional view of a conventional NPN bipolar transistor formed from a single polysilicon layer.
Figure 1B:
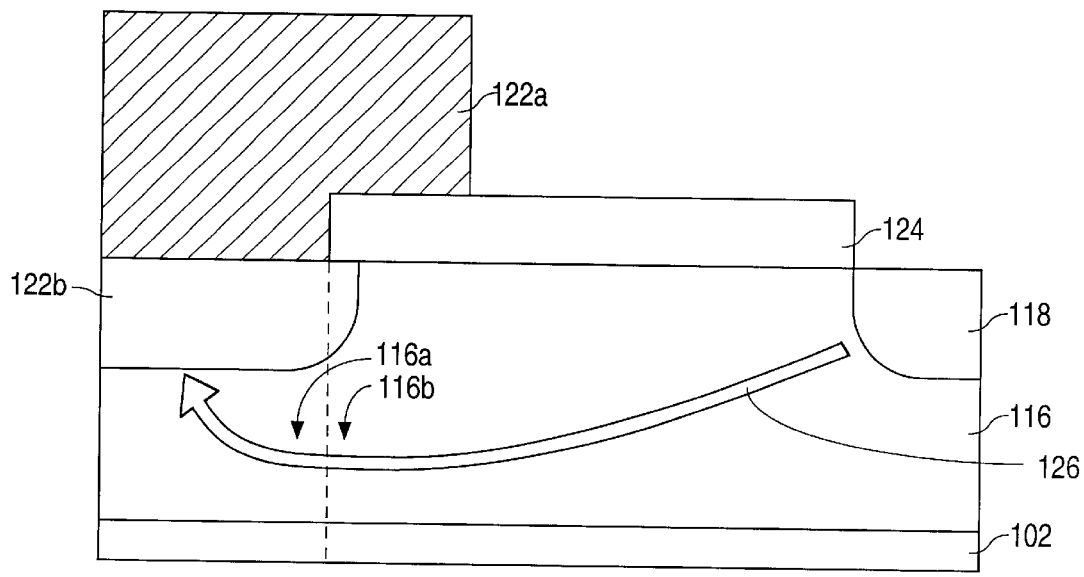
FIG. 1B shows an enlarged cross-sectional view of an edge portion of the emitter base junction of the device of FIG. 1A.
Figure 2A:
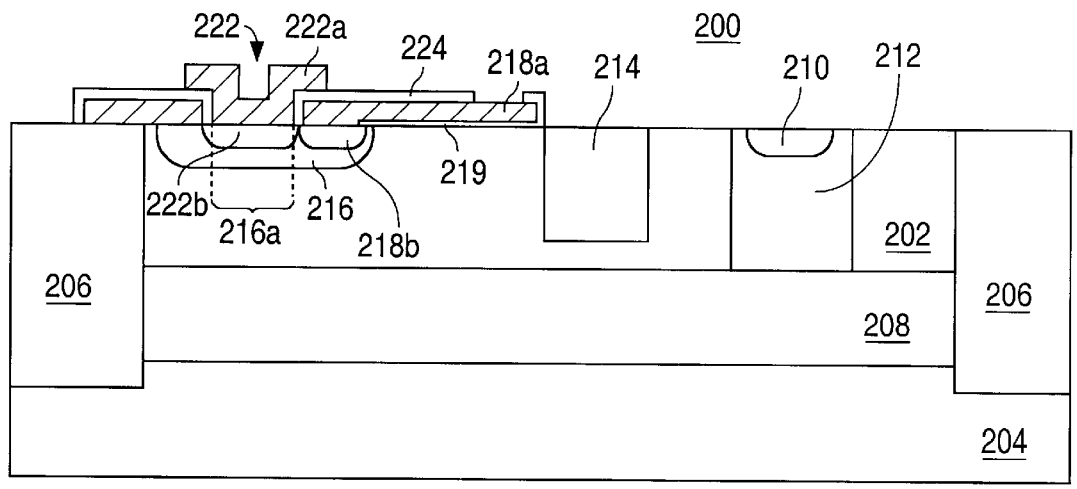
FIG. 2A shows a cross-sectional view of a conventional NPN bipolar transistor formed from two polysilicon layers.
Figure 2B:
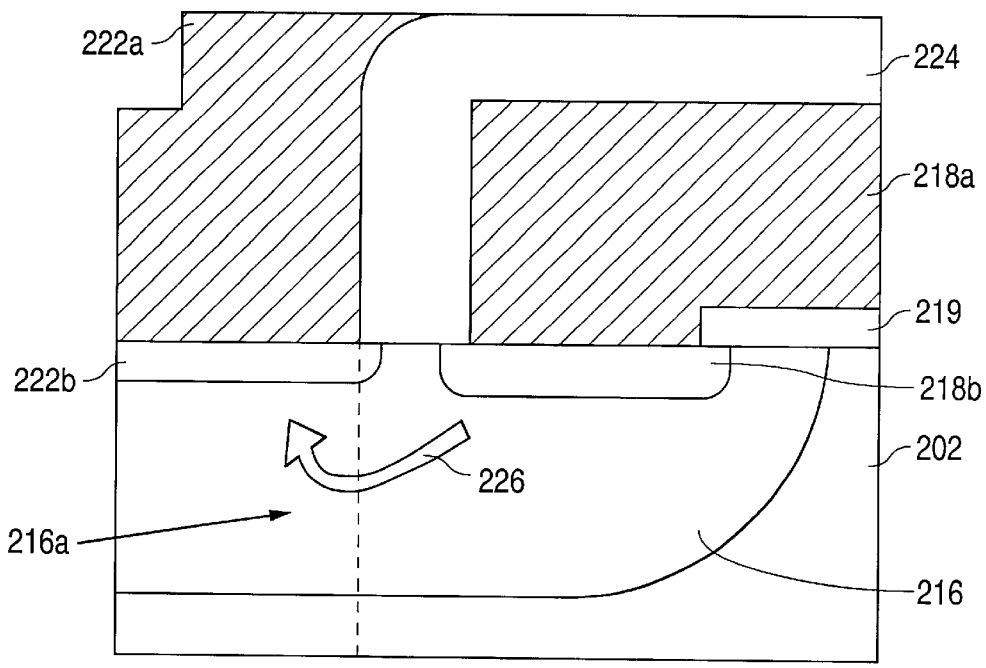
FIG. 2B shows an enlarged cross-sectional view of an edge portion of the emitter/base junction of the device of FIG. 2A.
Figure 3A:
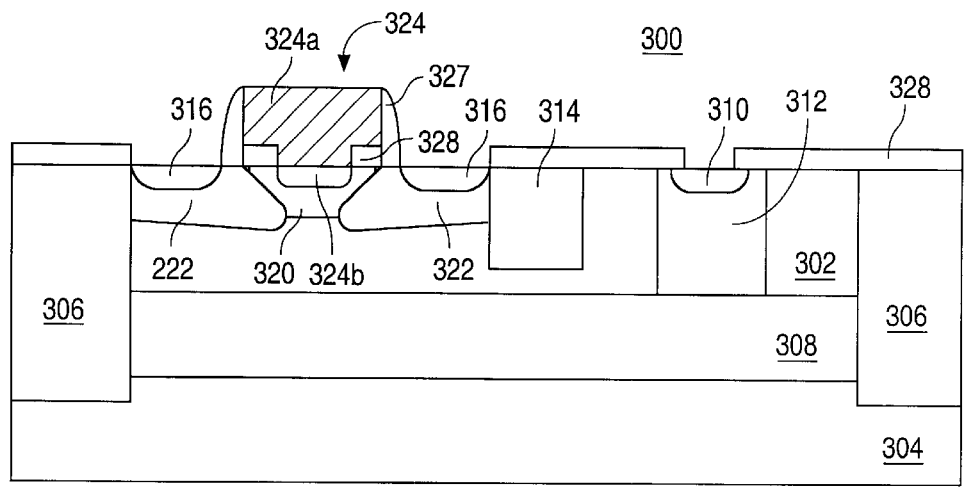
FIG. 3A shows a cross-sectional view of one embodiment of a NPN bipolar transistor formed from a single polysilicon layer in accordance with the present invention.

FIG. 3A shows a cross-section view of one embodiment of an NPN bipolar transistor formed from a single polysilicon layer in accordance with the present invention. NPN bipolar transistor 300 lies within N-well 302 formed within P-type silicon 304.

Bipolar transistor 300 is electrically isolated from the effects of adjacent semiconductor devices by inter-device isolation structures 306. Isolation structures 306 could comprise oxide structure formed by LOCOS processes, dielectric-filled deep trenches, doped isolation regions, or various combinations of these structures.

Bipolar transistor 300 includes a buried N+ collector layer 308 connected to a collector contact 310 by N+ sinker structure 312. Collector contact 310 and sinker 312 are electrically isolated from remainder of transistor 300 by intra-device isolation structure 314. Isolation structure 314 could comprise an oxide structure formed by a LOCOS process or a dielectric-filled shallow trench.

Bipolar transistor 300 further includes intrinsic and link P-type base regions 320 and 322 respectively, as well as base contact region 316, all formed within N-well 302. Link base 322 is contiguous with both intrinsic base 320 and base contact region 316.

Bipolar transistor 300 also includes diffused polysilicon emitter structure 324. Emitter 324 includes a polysilicon contact component 324a and a diffused single crystal component 324b. Polysilicon emitter component 324a bears a thin dielectric spacer 327 along its sides. Polysilicon emitter component 324a may be formed from the same N-type polysilicon layer used to create the gates of associated CMOS devices.

Diffused single crystal component 324b is formed by thermal diffusion of N-type dopant from polysilicon emitter component 324a into intrinsic base 320. Dielectric material 328 lies above portions of the single crystal silicon, including between the edge of polysilicon emitter component 324a and intrinsic base 320.

Figure 3B:
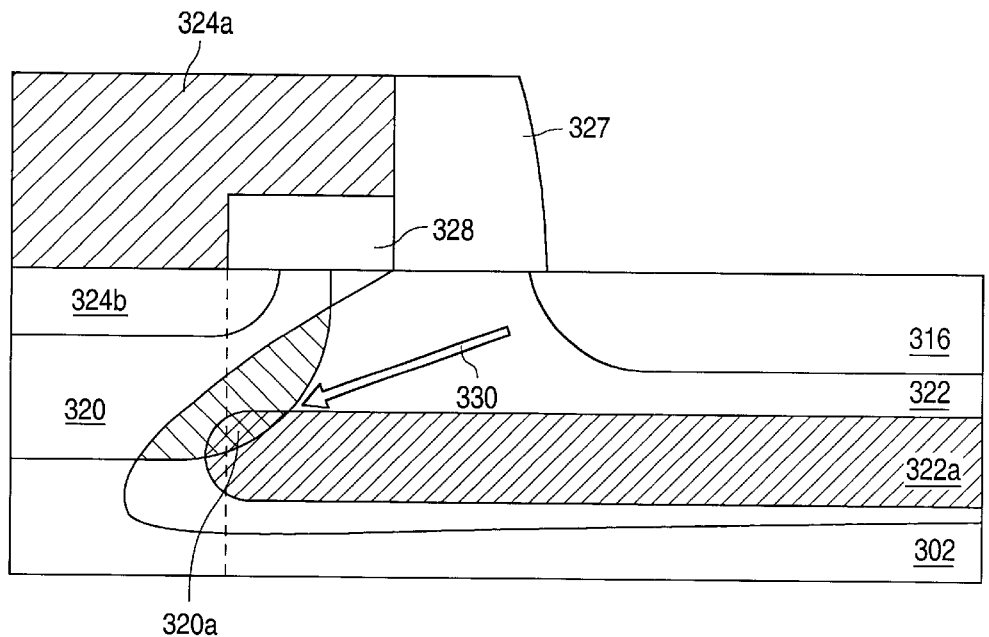
FIG. 3B shows an enlarged cross-sectional view of an edge portion of the emitter/base junction of the device of FIG. 3A.

FIG. 3B shows an enlarged cross-sectional view of an edge portion of the base-emitter junction of the bipolar device of FIG. 3A. FIG. 3B illustrates the low resistance conductive path 330 between base contact region 316 and intrinsic base 320. The lowered resistance of conductive path 330 is directly attributable to the configuration of base regions 316, 320, and 322. Specifically, as shown below in FIG. 4C, intrinsic base 320 is the product of ion-implantation through the same window in which the polysilicon emitter component is formed.

Because link base 322 is the product of tilted ion-implantation, link base 322 includes a highly doped region 322a which extends an appreciable lateral distance beneath diffused polysilicon emitter structure 324. Highly doped link base portion 322a thus overlaps intrinsic base 320 in region 320a, thereby creating conductive path 330 having uniformly high dopant concentration between base contact 316 and intrinsic base 320.

Figure 4A:
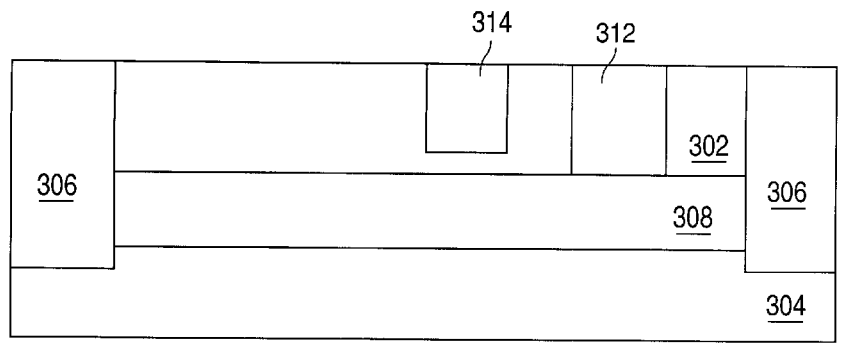
FIGS. 4A–4I show cross-sectional views of one embodiment of a process flow for forming the NPN transistor of FIGS. 3A–3B.

FIGS. 4A–4I show cross-sectional views of one embodiment of a process flow for forming the single-poly bipolar transistor of FIGS. 3A–3B. FIG. 4A shows the starting point for the process, wherein N-well 302, buried N+ collector layer 308, and N+ sinker 312 are formed in P-type silicon 304. Inter-device isolation structures 306 are then formed to electrically isolate the transistor from the electromagnetic fields of adjacent devices. Intra-device isolation structure 314 is formed to insulate sinker 312 from other portions of the device.

Figure 4B:
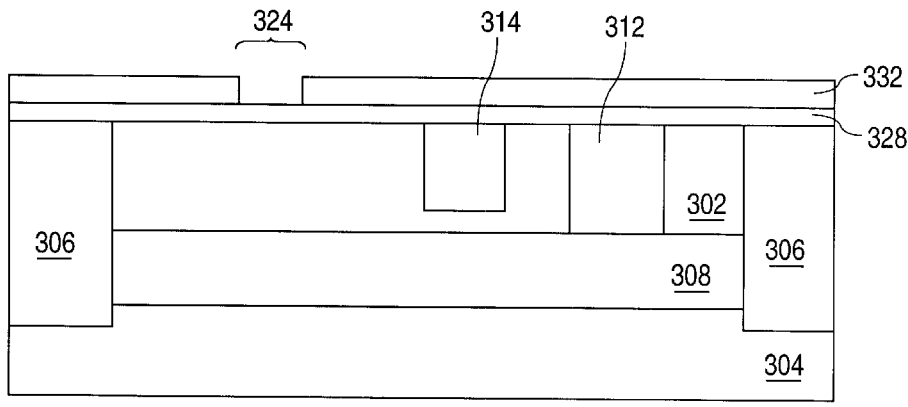

FIG. 4B shows the next step, wherein dielectric material 328 is formed over the silicon and the isolation structures, and first photoresist mask 332 is patterned over dielectric layer 328. Dielectric material 328 may be composed of silicon oxide, silicon nitride, or even a plurality of dielectric layers. Unmasked portions of dielectric material 328 are then etched to produce window 334.

Figure 4C:
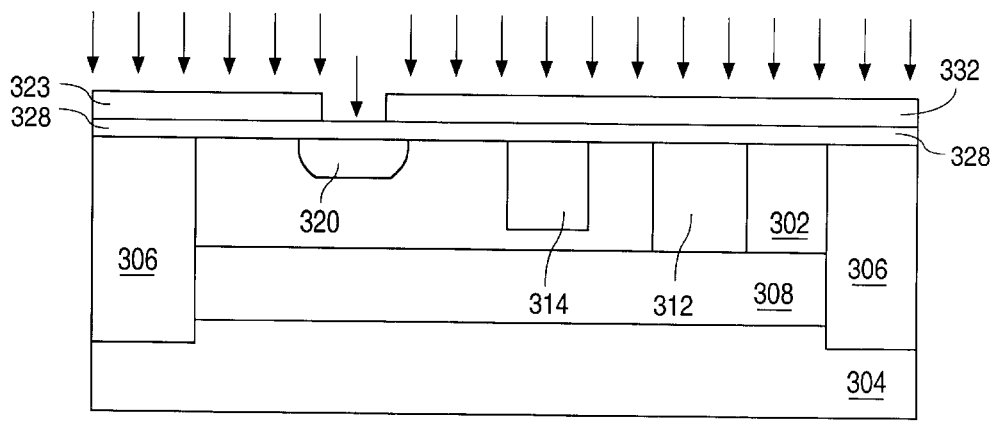

FIG. 4C shows implantation of P-type dopant through window 334 to form intrinsic base region 320. P-type dopant may be implanted to form intrinsic base 320 in the same step that dopant is implanted into pldd regions of associated PMOS devices.

Figure 4D:
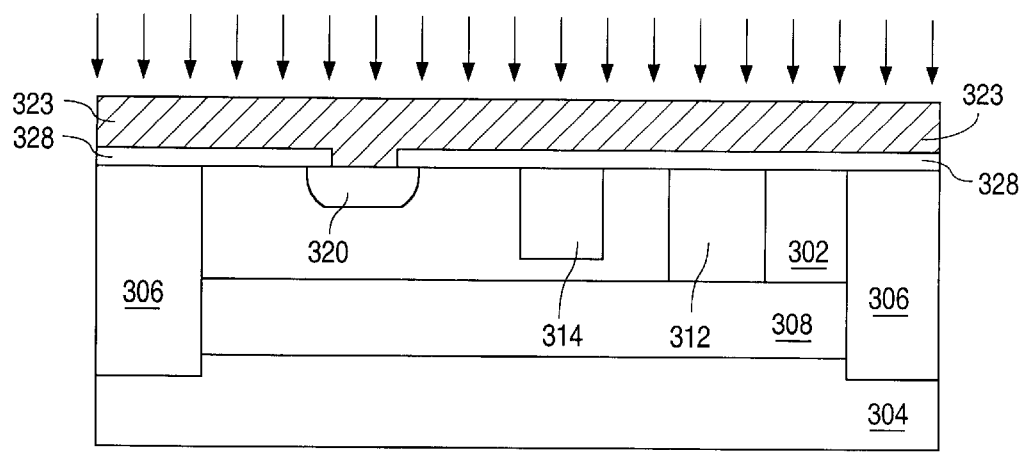

FIG. 4D shows etching of dielectric layer 328 in window 334, followed by removal of first photoresist mask 332. Polysilicon layer 323 is then formed and implanted with N-type dopant. Polysilicon layer 323 may be deposited and implanted in the same step that polysilicon comprising the gates of associated CMOS transistors are formed.

Figure 4E:
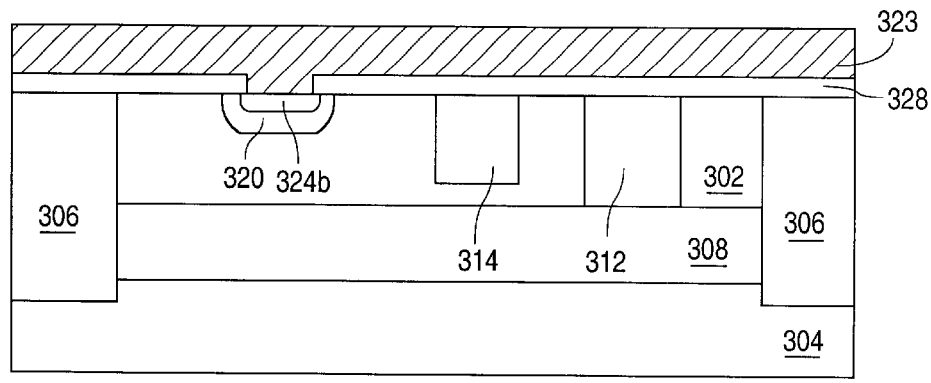

FIG. 4E further shows subsequent heating of implanted polysilicon layer 323, causing diffusion of N-type dopant out of polysilicon layer 323 into underlying intrinsic base 320 and forming single crystal emitter component 324b.

Figure 4F:
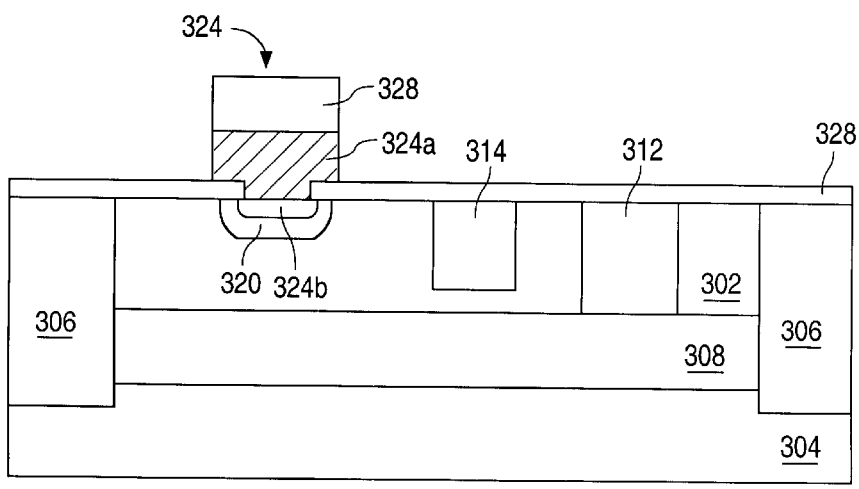

FIG. 4F shows patterning of second photoresist mask 338, followed by etching of N-doped polysilicon layer 323 in unmasked regions to create polysilicon emitter contact component 324a. This masking and etching step can be the same used to define the gates of associated CMOS transistors.

Figure 4G:
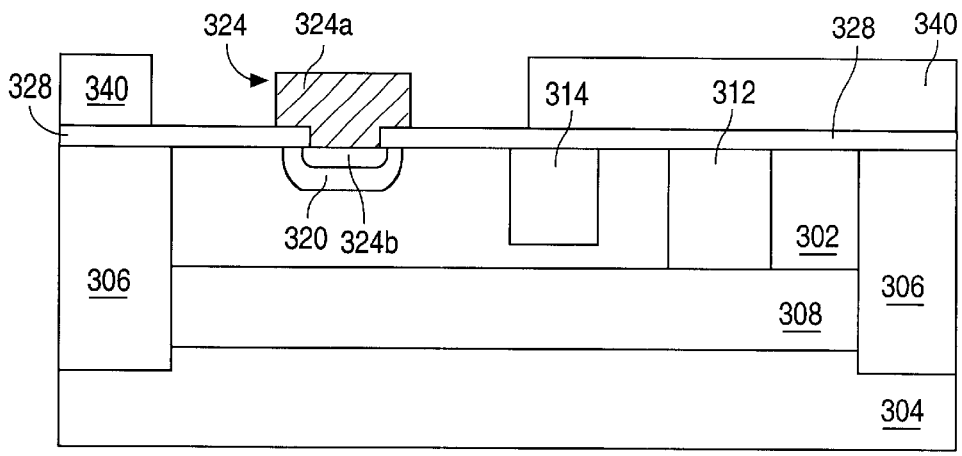

FIG. 4G shows the stripping of second photoresist mask 338, followed by patterning of third photoresist mask 340. Third photoresist mask 340 excludes regions adjacent to diffused polysilicon emitter 324.

Figure 4H:
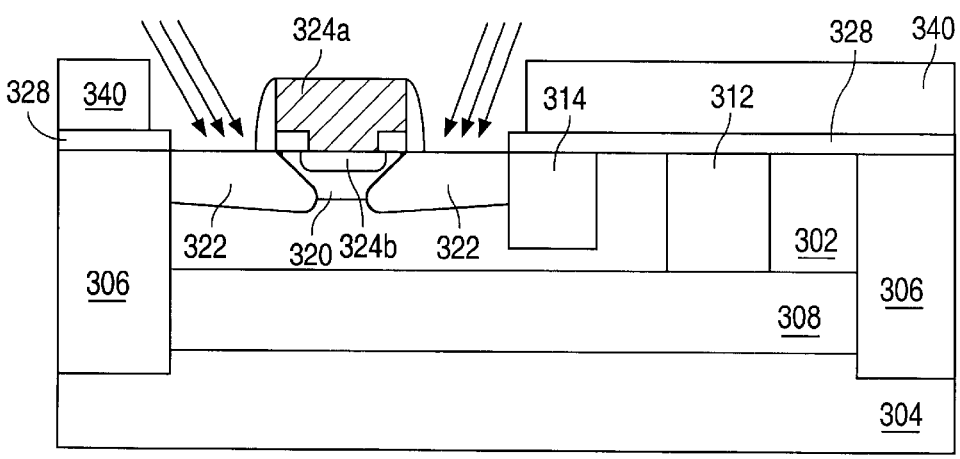

FIG. 4H shows tilted ion implantation of P-type dopant into regions exposed by third photoresist mask 340, creating link base regions 322. In this step, P-type dopant is implanted at an angle of less than 90° to the underlying silicon. This tilted implant is masked by diffused polysilicon emitter 324, such that the resulting link base 322 extends far enough underneath the edge of emitter 324 to overlap with intrinsic base 320. This creates a short, highly doped, low-resistance conductive path between intrinsic base 320 and the subsequently-formed base contact region. A brief thermal processing step is performed after the tilted implant to anneal implant damage and to further drive-in the implanted dopant.

Although not shown in FIG. 4H, at this point in the process additional P type dopant may be vertically implanted into unmasked regions, as a result of formation of pldd regions of associated MOS transistors. This step merely serves to further increase surface base dopant concentration.

Figure 4I:
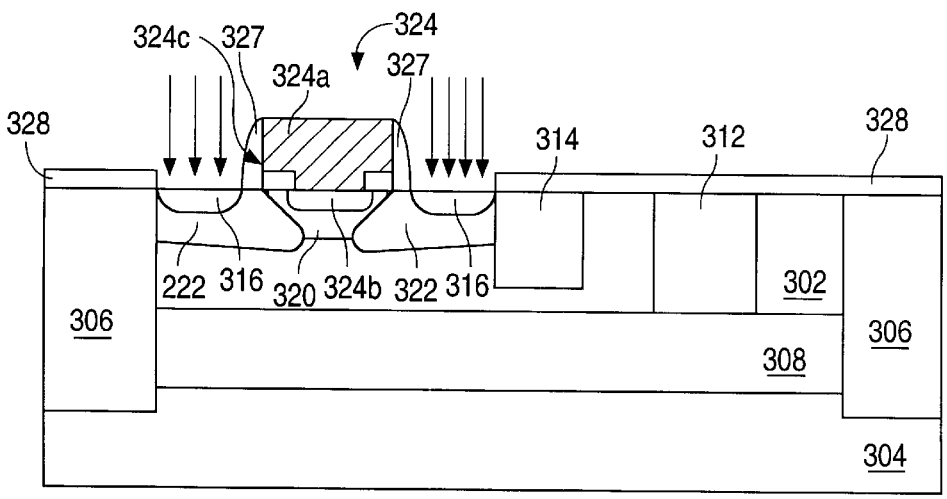

FIG. 4I shows subsequent formation of a thin dielectric film over the entire surface, followed by carefully controlled anisotropic etching to yield lateral spacers 327 along sidewalls 324c of diffused polysilicon emitter 324. This step may coincide with creation of lateral spacers along the gate sidewalls of associated CMOS devices.

FIG. 4I also shows subsequent implantation of P-type dopant masked by extrinsic polysilicon emitter 324 and lateral spacers 327, to form self-aligned base contact region 316. This implantation of P-type dopant may coincide with implant of source/drain regions of associated PMOS devices.

Fabrication of the single-poly NPN bipolar transistor device in accordance with the present invention is completed by forming contacts with the device. A collector contact is formed by etching through dielectric material 328 above sinker 312.

The single-poly bipolar transistor in accordance with the present invention offers a number of important advantages over previous designs. First, the base resistance of the device is lowered relative to conventional single-poly bipolar designs. This is due to the presence of the link base region created by tilted ion implantation. The link base elevates the dopant concentration and hence lowers the resistance of the conductive path between the base contact and the intrinsic base.

A second important advantage of the present invention is that the process flow is substantially less complex as compared with fabrication of a conventional double-poly bipolar transistor device. A second polysilicon layer is not required to form a diffused polysilicon base structure. This avoids the yield loss and increased cost associated with depositing, implanting, masking, and etching a second polysilicon layer. In addition, the "poly-stringer" problem discussed at length above is entirely avoided.

The processing advantage afforded by the present invention becomes even more apparent when a single-poly bipolar transistor in accordance with the present invention is fabricated in conjunction with a device already requiring tilted ion implantation, such as an LDMOS. Under such circumstances, implantation of the link base can be coincident with implantation of the LDMOS body.

Although the invention has been described in connection with one preferred embodiment, it should be understood that the invention should not be unduly limited to this specific embodiment. Various other modifications and alterations in the process of this invention will be apparent to those skilled in the art without departing from the scope and spirit of the present invention.

For example, while an NPN bipolar transistor has been described above in connection with FIGS. 3–4I, the present invention is also applicable to fabricate a PNP bipolar transistor. Because P-type polysilicon exhibits a higher sheet resistance than N-type polysilicon, a silicided emitter contact would be required to overcome this increased resistance, adding complexity to the process flow. However, the high diffusion coefficient of boron (P-type dopant) relative to arsenic (N-type dopant) could result in migration of dopant from the polysilicon emitter contact component during the anneal and drive in following the tilted base implant, thereby obviating the need for a separate thermal diffusion step.

Moreover, the process in accordance with the present invention should not be limited to the specific order of steps depicted above in connection with FIGS. 4A–4I. Specifically, while in FIG. 4D the doping of the polysilicon layer is described as occurring by ion implantation, this is not required. The polysilicon could also be doped in situ during chemical vapor deposition. Similarly, while FIG. 4D shows etching of the polysilicon layer after doping has been performed, this is also not required and polysilicon doping could occur after etching and remain within the province of the present invention.

Another possible processing variation leading to an alternative embodiment would be creation of a polysilicon emitter contact structure having tapered, rather than vertical, sidewalls. This sidewall profile could result from careful control of etching conditions during etching of the polysilicon layer. The presence of tapered polysilicon emitter sidewalls would affect the characteristics of the link base, as less polysilicon would be available to mask the tilted ion implant.

An additional processing variation leading to another alternative embodiment would be to form the single crystal emitter component directly in the silicon substrate by ion-implantation, rather than by thermal diffusion of dopant out of the polysilicon emitter contact component. In such an alternative embodiment, dopant of the first conductivity type could be ion-implanted through the dielectric window prior to formation of the polysilicon layer.

A further processing variation leading to another alternative embodiment would be the use of multiple dielectric layers during fabrication. For example, dielectric layer 328 shown in FIGS. 3A–4F could be a single layer as depicted, or could be composed of multiple layers such as the nitride/pad oxide combination commonly used to mask LOCOS formation. In the event that such a combination is utilized, the nitride component in the window region would likely need to be removed prior to ion implant of the intrinsic base as shown in FIG. 3C.

Finally, while the well/buried collector layer configuration is conventionally formed by 1) introducing dopant into the surface of a silicon substrate, 2) forming epitaxial silicon over the silicon substrate, and then 3) forming the well within the epitaxial silicon, this sequence of steps is not required by the present invention. The buried collector layer and well could be formed directly in the substrate by ion implantation.

Given the multitude of embodiments described above, it is intended that the following claims define the scope of the present invention, and that methods and structures within the scope of these claims and their equivalents be covered hereby.

What is claimed is:

1. The bipolar transistor formed by the process comprising the steps of:

forming a buried highly doped collector region of the first conductivity type in a semiconductor material;

forming a well of a first conductivity type over the buried highly doped collector region;

forming a dielectric layer having a window over the collector region in the well;

introducing dopant of a second conductivity type opposite the first conductivity type through the window to form an intrinsic base region;

forming a polysilicon layer over the dielectric layer and within the window;

introducing dopant of the first conductivity type into the polysilicon layer;

etching the polysilicon layer to form a polysilicon emitter contact component extending at least over the window;

introducing dopant of the first conductivity type into the semiconductor material directly underneath the polysilicon emitter contact component and above the intrinsic base to form a single crystal emitter component; and ion-implanting dopant of the second conductivity type at an angle of less than 90° to the semiconductor material to form a link base region, the link base region overlapping the intrinsic base region.

2. The bipolar transistor according to claim 1 wherein the process further comprises the steps of:

forming a dielectric spacer along a side of the polysilicon emitter contact component; and implanting dopant of the second conductivity type into semiconducting material masked by the polysilicon emitter and the dielectric spacer to form a base contact region overlapping the link base.

3. The bipolar transistor according to claim 1 wherein:

the semiconductor material is a single crystal silicon substrate;

the step of forming the buried highly doped collector region comprises introducing dopant of the first conductivity type into the a surface of the silicon substrate and then forming epitaxial silicon over the surface of the silicon substrate; and the step of forming the well includes forming the well in the epitaxial silicon over the highly buried highly doped buried collector layer.

4. The bipolar transistor according to claim 1 wherein:

the semiconductor material is a single crystal silicon substrate;

the step of forming the buried highly doped collector region comprises ion-implanting dopant of the first conductivity type into the silicon substrate at a first energy; and the step of forming the well comprises ion-implanting dopant of the first conductivity type into the silicon substrate at a second energy lower than the first energy.

5. The bipolar transistor according to claim 1 wherein the step of introducing dopant of the first conductivity type into the semiconductor material to form a single crystal emitter component comprises causing thermal diffusion of dopant out of the polysilicon emitter contact component.

6. The bipolar transistor according to claim 1 wherein the step of introducing dopant of the first conductivity type through the window into the semiconductor material to form a single crystal emitter component comprises ion implanting dopant of the first conductivity type into the semiconductor material prior to formation of the polysilicon layer.

* * * * *